(12) United States Patent
Zhang et al.

(10) Patent No.: US 7,725,275 B2
(45) Date of Patent: May 25, 2010

(54) TELEMATICS-BASED METHOD AND SYSTEM OF BATTERY PARASITIC LOAD VALIDATION FOR A VEHICLE FLEET

(75) Inventors: Yilu Zhang, Northville, MI (US); Dennis F. Regmont, Lake Orion, MI (US); Nathan Ampunan, Novi, MI (US); Mark J. Rychlinski, Farmington Hills, MI (US); Krishnaraj Inbarajan, Troy, MI (US); Haiping Song, Plymouth, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 206 days.

(21) Appl. No.: 11/957,436

(22) Filed: Dec. 15, 2007

(65) Prior Publication Data

US 2009/0157335 A1  Jun. 18, 2009

(51) Int. Cl.
*G01R 31/36* (2006.01)
(52) U.S. Cl. ...................................................... 702/63
(58) Field of Classification Search ................... 702/63
See application file for complete search history.

(56) References Cited

U.S. PATENT DOCUMENTS

| 6,300,763 | B1 | 10/2001 | Kwok |
| 6,362,598 | B2 | 3/2002 | Laig-Horstebrock et al. |
| 6,515,456 | B1 * | 2/2003 | Mixon ........................ 320/160 |
| 6,842,708 | B2 * | 1/2005 | Odaohhara ................... 702/63 |
| 7,561,978 | B2 * | 7/2009 | Koch et al. .................... 702/63 |

* cited by examiner

*Primary Examiner*—Drew A Dunn
*Assistant Examiner*—Jonathan Teixeira Moffat

(57) ABSTRACT

Parasitic loads on a vehicular battery are evaluated based on an estimated reduction in the state of charge of the battery over the course of an engine-off state.

16 Claims, 2 Drawing Sheets

TELEMATICS-BASED METHOD AND SYSTEM OF BATTERY PARASITIC LOAD VALIDATION FOR A VEHICLE FLEET

TECHNICAL FIELD

The embodiments described herein relate generally to monitoring of storage of energy in an electrical storage battery on a motorized vehicle, such as an automobile or truck.

BACKGROUND

The electrical storage battery on a motorized vehicle has historically been a crucial component, the battery being used not only as a source of energy for cranking the vehicle's engine during a startup, but also as a ballast for storing electrical energy, in conjunction with the charging system and voltage regulation circuitry during vehicle operation. The electrical storage battery is sometimes referred to as the Starting-Lighting-Ignition ("SLI") battery. The on-board SLI battery has to have adequate state of charge for starting the vehicle's engine, in the variety of environmental conditions in which the vehicle is to be operated, including a wide range of temperature extremes.

In modern versions of motorized vehicles, the SLI battery serves the additional function of supplying electrical currents to various systems other than the vehicle's starter motor during start-up. Such systems may include vehicle security systems, which periodically "wake up", or are called to wake up by the vehicle's operator. Other such systems include keyless remote wireless access devices. In addition, electronic control systems ("ECS") for engine and accessory management during operation rely on an electrical system featuring an SLI battery. Thus, an SLI battery is desirously of high reliability to ensure proper and complete vehicle design functionality. Hence, failure of the SLI battery may manifest itself in several symptoms, including a vehicle no-start situation.

Battery "parasitic load" is the electrical load presented on a vehicle when the ignition key is in the off position, which load may be constant or intermittent. Excessive parasitic load can drain an SLI battery to a low state of charge ("SOC") which can prevent the vehicle from being started at a later point in time. Furthermore, a relatively low SOC can be harmful to SLI battery life, especially for batteries which are not designed to tolerate repeated deep charge cyclings. This may be most pronounced in modem vehicles as the number of on-board computer modules which need to wake up periodically during ignition-off situation are increased.

Conditions of excessive parasitic load may in some instances be difficult to detect, since parasitic loads occur during the ignition-off period, and equipment intended to measure parasitic load itself can cause some charge drainage. Excessive parasitic load can also be caused by intermittent unknown faults, including irregularities in module wake up, which can be triggered by specific conditions that may not be readily replicated at-will during an after-the-fact diagnostic attempt. Accordingly, the root cause of excessive parasitic load encountered by an operator in the field may be difficult to reproduce during a service procedure.

SUMMARY

A vehicle has an engine and an on-board electrical storage battery and is operative in alternating engine-on and engine-off states. A process for evaluating parasitic load on the battery includes determining a first estimate of the state of charge of the battery substantially just prior to the beginning of an engine-off state or during said engine-off state, and determining a second estimate of the state of charge of the battery during said engine-off state subsequent to the first estimate of the state of charge determination. An estimate of the parasitic load of the battery is determined based on the difference between the first and second estimates of state of charge of the battery.

BRIEF DESCRIPTION OF THE DRAWINGS

Embodiments of invention may take physical form in certain parts and arrangement of parts, the preferred embodiment of which will be described in detail and illustrated in the accompanying drawings which form a part hereof, and wherein.

DETAILED DESCRIPTION

Figure 1:
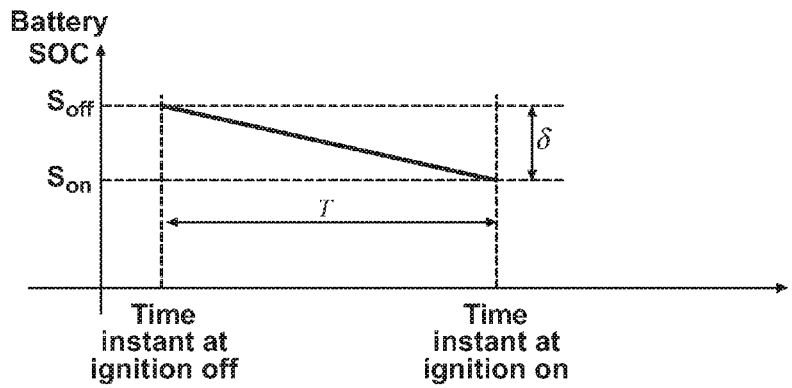
FIG. 1 graphically illustrates considerations useful in an one embodiment of a method for determining parasitic load on an SLI battery.

Referring now to the drawings, wherein the showings are for the purpose of illustrating certain exemplary embodiments only, and not for the purpose of limiting the same, FIG. 1 graphically illustrates considerations useful in an exemplary embodiment of a method for determining parasitic load on an SLI battery. As used herein, the terms ignition-on and engine-on may be used interchangeably. Similarly, the terms ignition-off and engine-off may be used interchangeably. A vehicle is operative in alternating engine-on and engine-off states. In one embodiment, while the vehicle ignition switch is in the off position (ignition-off), an on-board module is pre-set to wake up periodically to measure the battery open circuit voltage ("OCV") via a voltage sensor, which measured OCV is stored in a non-volatile memory, along with the point in time the OCV was measured. For SLI batteries, OCV and temperature information taken together can indicate the state of charge, where the battery state of charge is defined as the remaining charge (in ampere-hours) in a battery, divided by the maximum rated battery capacity that was measured at constant current and temperature conditions (e.g. 20 hour discharge at 25° C.).

The battery SOC may be expressed as a percentage of the battery's total charge capacity. In one embodiment, when the vehicle is turned on, the last estimated SOC before ignition-on is used as the initial value for continuous estimation of battery SOC during the vehicle ignition-on. Since sensor-derived information, such as current, is continuously available, many algorithms known in the art can be used to perform the estimation of SOC, with coulomb-integration or current-integration over time being a preferred method. However, any method for estimating SOC of an SLI battery known in the art may be used in a process according to the invention. In an embodiment, the estimated SOC obtained is continuously saved in intervals as desired and updated in a non-volatile memory until the vehicle is turned off.

Thus, referring to FIG. 1, a process according to one embodiment estimates the battery SOC information: 1) during an engine-off state or substantially just prior to the beginning of the engine-off state (referred to as $S_{off}$); and 2) at various time instances during the engine-off state (referred to as $S_{on}$). The estimate of $S_{off}$ is substantially just prior to the beginning of the engine-off state when it reasonably approximates the state of charge at the beginning of an engine off state as described further herein below. Therefore, $S_{off}$ may be estimated on either side of the start of the engine-off state. SOC estimations in such fashion substantially ignore all but parasitic drains upon the battery. The difference between $S_{off}$ and $S_{on}$ is the amount energy drained from the battery in the time period therebetween. This difference represents the average parasitic load in the time period under consideration, which may be expressed in terms of current. Mathematically, the above can be represented as:

$$\delta = (S_{off} - S_{on}) \times C = P \times T + \epsilon \quad (1)$$

wherein $S_{off}$ and $S_{on}$ are as defined above, P is the estimated parasitic load, T is the elapsed time between $S_{off}$ and $S_{on}$, C is the battery reserved capacity in Ampere Hours, and $\epsilon$ is a constant that is used to capture the fact that certain (non-parasitic) loads are not turned off immediately after ignition off. $\epsilon$ is estimated, depending on exact vehicle features, some of which may be optional.

Because $S_{off}$ and $S_{on}$ may be corrupted by unknown electronic "noise", a better parasitic load estimation may in some instances be achieved by fitting the model of the equation above with data from multiple ignition cycles. In such instances, the estimation of parasitic load may be reduced to simply solving the following set of linear system of equations with least square curve fitting:

$$\begin{bmatrix} \delta_1 \\ \delta_2 \\ \vdots \\ \delta_M \end{bmatrix} = \begin{bmatrix} t_1 & 1 \\ t_2 & 1 \\ \vdots & \vdots \\ t_M & 1 \end{bmatrix} \cdot \begin{bmatrix} P \\ \varepsilon \end{bmatrix} \quad (2)$$

in which M is the number of observations, $t_i$ ($i=1 \ldots M$) is the instance of elapsed time and $\delta_i$ ($i=1 \ldots M$) is the instance of SOC loss. The estimated coefficients P and $\epsilon$ are the estimated parasitic load and the SOC drop caused by the remaining load right after ignition off, respectively.

Additionally, the solution provides the confidence intervals of the estimated coefficients, which describes an interval in which the estimates are accurate with certain confidence. In preferred embodiments, a 95% confidence interval is utilized; however, any desired confidence interval may be employed. In embodiments wherein all the information necessary for the estimation algorithm is stored in a computer memory (which may be volatile or non-volatile and which may be disposed on the motorized vehicle itself or at a location which is remote from the vehicle), it can be retrieved by an on-board module ("telematics module") and uploaded, such as by wireless transmission, to a data processing center during vehicle ignition-on. In such embodiment vehicle performance data may be remotely stored, monitored, and/or manipulated for diagnostic purposes. In one embodiment, statistical data concerning a particular vehicle is wirelessly transmitted to the vehicle's owner, to provide remote notification of the state of charge of the vehicle's SLI battery.

Since parasitic load occurs predominantly during an ignition-off state of a motorized vehicle, in one embodiment there are two SOCs directly involved in a parasitic load estimation. The first of these SOC estimations may be substantially at the beginning of ignition-off, which may be referred to as $S_{off}$.

The second is the SOC estimated substantially at the end of the ignition-on state, which may be referred to as $S_{on}$. In one embodiment, the difference between these two values represents the amount of electrical energy taken out of battery due to parasitic load. Therefore, their difference divided by the elapsed time between their respective measurements provides the amount of average parasitic load.

The parameter $S_{on}$ may be estimated using the latest (before a particular ignition-on state) collected OCV. At a given temperature, an SLI battery SOC has a linear relationship with its OCV, which is dependent on battery temperature. The relationship is readily determined empirically through battery testing at different temperatures. One method for obtaining an indication of the temperature of the battery includes measuring the ambient temperature surrounding the battery. An alternative method for obtaining an indication of the temperature of the battery is via a battery temperature sensor that is attached directly to the battery itself, or is in contact with the battery electrolyte. When estimating battery SOC, one may measure the temperature and OCV, and then use the known relationship, which is often linear over typical temperature ranges of interest, to obtain SOC values.

According to one embodiment, during ignition-on states, the battery charging/discharging current is constantly measured. An integration of the battery charging/discharging current over time during engine operation provides the amount of charge stored or removed from the battery. This amount plus the initial SOC at ignition-on may provide the SOC at the ignition off, $S_{off}$ provided that it is updated reasonably close to the beginning of the engine-off state. Thus, in one embodiment, the $S_{off}$ used in parasitic load estimation may be an SOC determined through current integration techniques during an engine-on state.

Figure 2:
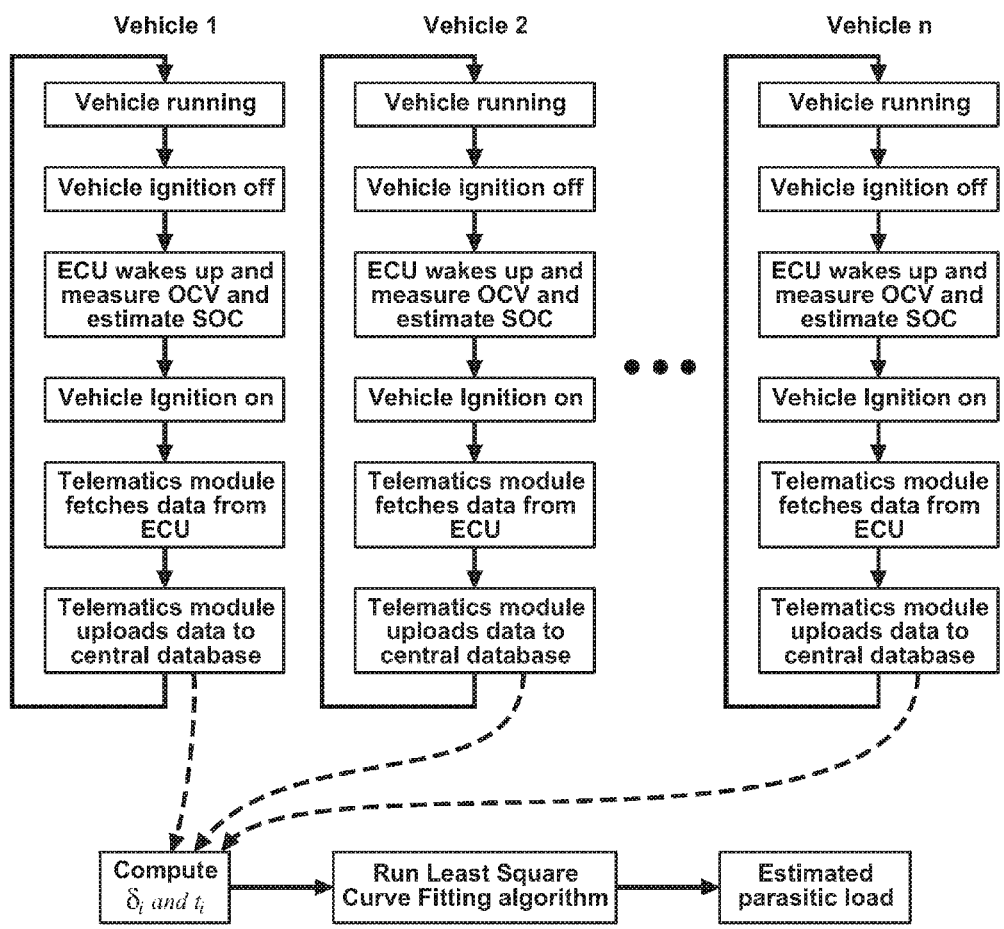
FIG. 2 shows a schematic overview of a process according to one embodiment for parasitic load estimation for a vehicle fleet.

In FIG. 2 is shown a schematic overview of a process according to one embodiment of the invention for parasitic load estimation for a vehicle fleet. In this embodiment, for each vehicle in a plurality of n vehicles, the successive steps of measuring and recording the open circuit voltage of the storage battery and estimating state of charge are carried out, and the data generated are transmitted to a central database 11 (FIGS. 3, 4) that is located remotely from each vehicle, and which central database 11 may be at a single location which serves the entire fleet. A plurality of linear equations per the foregoing is generated and solved to provide statistically-significant battery parasitic load information concerning the entire fleet or ensemble of vehicles. An additional benefit of such information is that it may be useful in performing vehicle system design validation, and ascertainment that the on-board electronics system of a plurality of motorized vehicles will meet a specified requirement for an entire vehicle fleet.

In one embodiment, the parasitic load estimated from each validation vehicle is compared with a design requirement, which may be a threshold of the limit parasitic load. In another embodiment, consideration is given that since the vehicles in the same vehicle program share the same design and are the result of the same manufacturing process, they should experience approximately the same average parasitic load as well. Therefore, the data from different vehicles in the same validation fleet can be used together to estimate the average parasitic load for the entire fleet. In this case, $\delta_i$ ($i=1 \ldots M$) in the set of linear equations above comes from all the vehicles in the validation fleet. The average parasitic load estimate obtained may then be compared with the specified design requirement. Such a telematics-based approach can capture intermittent faults, such as the excessive parasitic load, while the vehicles are operating in the field.

Figure 3:
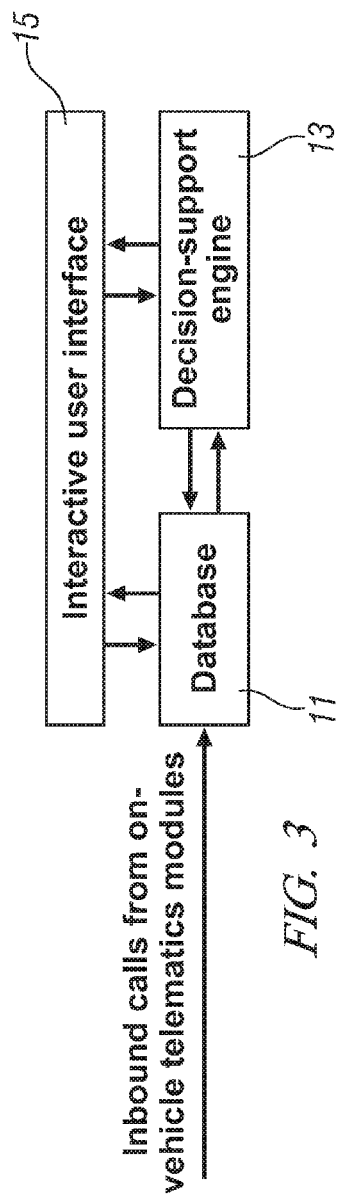
FIG. 3 shows a schematic of a decision support system useful in implementing a battery parasitic load determination.

In FIG. 3 is shown a schematic view of a decision support system useful in implementing various embodiments, which decision support system includes a central database 11, a decision-support engine 13, and an interactive user interface 15. The database 11 is useful for storing vehicle battery state of charge, open circuit voltage, temperature, and any other vehicle system data or vehicle system performance data, as well as intermediate and final analysis results, as desired. In one embodiment, the database 11 is intended to be updated continuously to incorporate new data uploaded from vehicles in use in the field. The user interface 15 in general preferably includes a microprocessor and allows a user to conduct various operations, such as retrieving a specific subset of data from the database, analyzing the data (which may include estimates of parasitic load), viewing the data or a subset of data in a visual format, and generating reports. In one embodiment, the user interface comprises a personal computer. In another embodiment the user interface comprises a node on a computer network. The operations carried out on the user interface 15 are in one embodiment supported by a decision-support engine 13, which is capable of decoding, archiving, and retrieving raw vehicle data to specific parameters. In one embodiment, the decision-support engine 13 performs appropriate algorithms to estimate the parasitic load, and can generate desired graphical or other outputs useful for interpreting results of the analysis.

Figure 4:
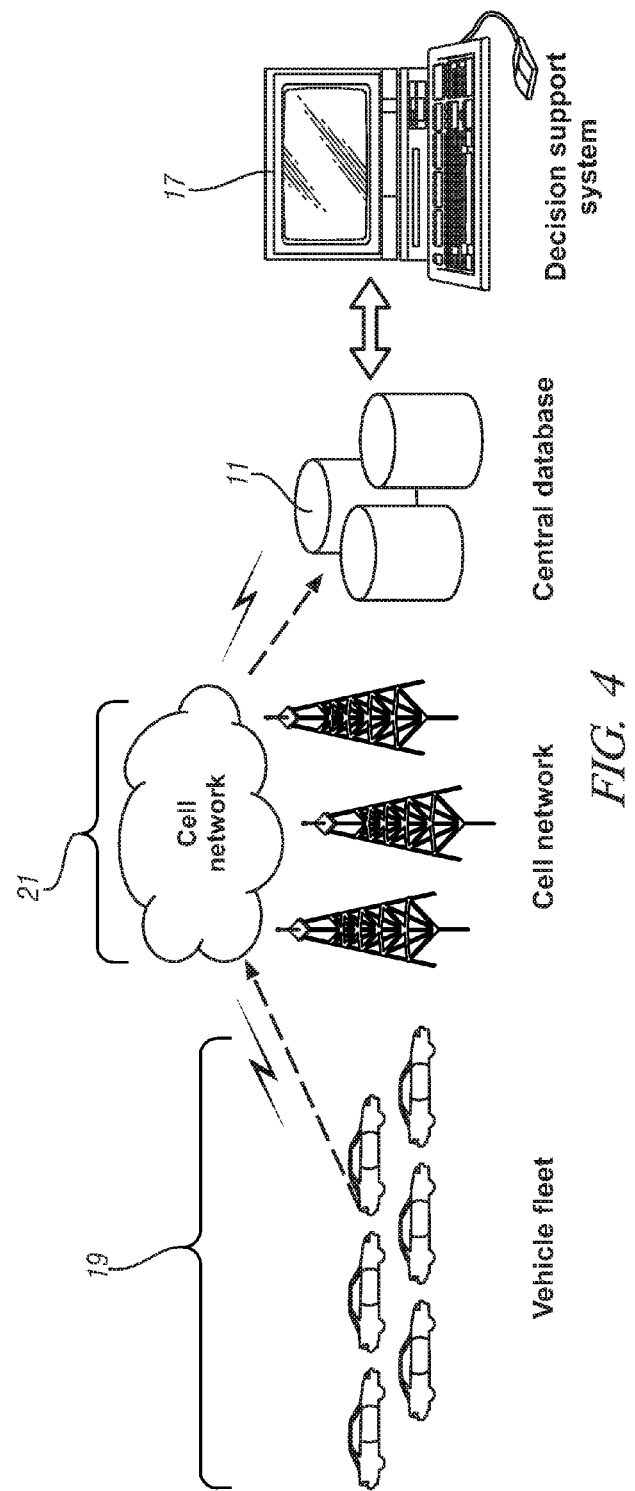
FIG. 4 shows a system useful for remotely monitoring vehicle performance data, including battery parasitic load.

In FIG. 4 is illustrated a system according to one embodiment of the invention, which is useful for monitoring vehicle performance data remotely. There are a fleet of validation vehicles which comprise a fleet 19, each of which are equipped with telematic modules for storing information that is necessary for the estimation algorithm for parasitic load of the SLI battery, as described herein. In one embodiment, during a validation period the fleet is driven by designated drivers, either in a predefined schedule or in a routine every-day-driving schedule, which may be any routine specified, or an ad hoc routine. In one embodiment, when the vehicle ignition switch of a given vehicle is in the on position, the telematics module accesses the vehicle performance data, including battery state of charge and open circuit voltage, from other onboard vehicle modules through an in-vehicle communication network, which is caused to be standard equipment on all of the participating vehicles. The telematics module then transmits a plurality of vehicle performance data through wireless communication, such as a cellular network 21, to a data center comprising a database. In a further embodiment, information derived from the data obtained and processed according to the invention is transmitted wirelessly back to individual vehicle owners.

The plurality of transmitted data may be predefined or dynamically defined by the remote data center 11. Battery parasitic load estimation algorithms are operated in the database environment via computer processor(s), in which uploaded vehicle performance data is analyzed. A decision-support system 17 may be used to report the analysis results, which may include the detected excessive battery parasitic load, to validation engineers or other interested personnel, who may in turn use the information in providing decisions concerning potential corrective actions, where applicable.

Thus, one of ordinary skill in the art appreciates that in certain embodiments one or more battery parasitic load determinations may be made on-board the vehicle itself, by means of the various sensors in conjunction with an on-board microprocessor. In one embodiment, this information may be transmitted wirelessly to a remote receiving station, for further analysis, which may include statistic compilations for the purpose of enabling remote vehicle design validation. In alternate embodiments, one or more of various measured and/or derived parameters including: the battery open circuit voltage; the indication of the temperature of the battery; an estimate of the engine-off state of charge of the battery; an estimate of the engine-on state of charge of the battery; and an estimate of the parasitic load of the battery may be wirelessly transmitted from the motorized vehicle, via a wireless network, to a database that is remotely-located with respect to vehicle, for various purposes, including statistic compilations for enabling remote vehicle design validation. In such embodiments, the calculation of battery parasitic load and other calculations and analyses may be undertaken at a location that is remotely-located from the actual vehicle(s) which are in service.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A process for evaluating parasitic load on an electrical storage battery of a vehicle having an engine and an on-board electrical storage battery, said vehicle operative in alternating engine-on and engine-off states, comprising:

for each of a plurality of engine-off states to obtain a plurality of equations:

determining a first estimate of the state of charge of the battery at a first time substantially just prior to the beginning of an engine-off state or during said engine-off state;

determining a second estimate of the state of charge of the battery at a second time during said engine-off state subsequent to the first estimate of the state of charge determination;

determining an elapsed time between said first time and said second time; and determining an estimate of the parasitic load of the battery based on the difference between the first and second estimates of state of charge of the battery and said elapsed time;

each equation having the form:

$$\delta = (S_{off} - S_{on}) \times C = P \times T + \epsilon$$

in which $S_{off}$ is the respective estimate of the state of charge of the battery substantially contemporaneous with the beginning of an engine-off state, and $S_{on}$ is the respective estimate of the state of charge of the battery substantially just prior to the beginning of the engine-on state that immediately follows the engine-off state, C is the battery reserved capacity in ampere*hours, P is the estimated parasitic load, T is an elapsed time between $S_{off}$ and $S_{on}$, $\delta$ is state of charge loss of the battery during the elapsed time T, and $\epsilon$ is a constant, so as to provide a set of linear equations of the form:

$$\begin{bmatrix} \delta_1 \\ \delta_2 \\ \vdots \\ \delta_M \end{bmatrix} = \begin{bmatrix} t_1 & 1 \\ t_2 & 1 \\ \vdots & \vdots \\ t_M & 1 \end{bmatrix} \cdot \begin{bmatrix} P \\ \varepsilon \end{bmatrix}$$

in which M is the number of observations, $t_i (i=1 \ldots M)$ is the instance of elapsed time and $\delta_i (i=1 \ldots M)$ is the instance of state of charge loss; and solving the set of linear equations to provide a statistical estimation of the parasitic load across the plurality of engine-off states.

2. The process according to claim 1 wherein determining a first estimate of the state of charge of the battery during said engine-off state is based upon battery open circuit voltage.

3. The process according to claim 1 wherein determining said second estimate of the state of charge of the battery comprises:
measuring at least one parameter selected from the group consisting of: the battery open circuit voltage, and an indication of the temperature of said battery; and
storing said measured at least one parameter in a computer memory.

4. The process according to claim 3 wherein said computer memory is disposed on-board of said vehicle.

5. The process according to claim 3 wherein said vehicle further includes a wireless transmitter, and wherein said measured at least one parameter is transmitted to computer memory that is disposed at a location which is remote with respect to said vehicle.

6. The process according to claim 1 wherein determining estimates of state of charge of the battery during said engine-off state comprises determining an indication of the temperature of said battery.

7. The process according to claim 1, further comprising:
providing said vehicle with a wireless transmitter; and
transmitting from said vehicle to computer memory that is remotely-located with respect to said vehicle at least one of the first estimate of the state of charge of the battery, the second estimate of the state of charge of the battery, an estimate of the state of charge of said battery determined during an engine-on state, and the estimate of the parasitic load of the battery.

8. A process for evaluating parasitic load on an electrical storage battery of a vehicle having an engine and an on-board electrical storage battery, said vehicle operative in alternating engine-on and engine-off states, comprising:
for each of a plurality of engine-off states to obtain a plurality of equations:
determining a first estimate of the state of charge of the battery at a first time substantially just prior to the beginning of an engine-off state or during said engine-off state;
determining a second estimate of the state of charge of the battery at a second time during said engine-off state subsequent to the first estimate of the state of charge determination; and
determining an estimate of the parasitic load of the battery based on the difference between the first and second estimates of state of charge of the battery and the elapsed time, wherein said elapsed time represents a difference between said first time and said second time;
each equation having the form:

$$\delta = (S_{off} - S_{on}) \times C = P \times T + \epsilon$$

in which wherein $S_{off}$ is the respective estimate of the state of charge of the battery substantially contemporaneous with the beginning of an engine-off state, and $S_{on}$ is the respective estimate of the state of charge of the battery substantially just prior to the beginning of the engine-on state that immediately follows the engine-off state, C is the battery reserved capacity in ampere*hours, P is the estimated parasitic load, T is an elapsed time between $S_{off}$ and $S_{on}$, $\delta$ is state of charge loss of the battery during the elapsed time T, and $\epsilon$ is a constant, so as to provide a set of linear equations of the form:

$$\begin{bmatrix} \delta_1 \\ \delta_2 \\ \vdots \\ \delta_M \end{bmatrix} = \begin{bmatrix} t_1 & 1 \\ t_2 & 1 \\ \vdots & \vdots \\ t_M & 1 \end{bmatrix} \cdot \begin{bmatrix} P \\ \varepsilon \end{bmatrix}$$

in which M is the number of observations, $t_i$ (i=1 ... M) is the instance of elapsed time and $\delta_i$ (i=1 ... M) is the instance of state of charge loss; and
solving the set of linear equations to provide a statistical estimation of the parasitic load across the plurality of engine-off states; and
wirelessly transmitting the estimate of the parasitic load of the battery from said vehicle to computer memory that is remotely-located with respect to said vehicle.

9. The process according to claim 8 wherein determining a first estimate of the state of charge of the battery substantially just prior to the beginning of an engine-off state is based upon current-integration.

10. The process according to claim 8 wherein determining a first estimate of the state of charge of the battery during said engine-off state is based upon battery open circuit voltage.

11. The process according to claim 8 further comprising:
wirelessly transmitting the estimated reduction in the state of charge of the battery over the course of an engine-off state from said vehicle to computer memory that is remotely-located with respect to said vehicle; and
providing a notification of a state of charge condition based on the wirelessly transmitted estimated reduction in the state of charge of the battery.

12. The process according to claim 8 wherein a least-square curve fitting method is employed in solving the set of linear equations.

13. A process for evaluating parasitic load on an electrical storage battery of a vehicle having an engine and an on-board electrical storage battery, said vehicle operative in alternating engine-on and engine-off states, comprising:
for each of a plurality of vehicles:
measuring a plurality of vehicle parameters during engine-on and engine-off states;
wirelessly transmitting said plurality of vehicle parameters from said vehicle to computer memory that is remotely-located with respect to said vehicle;
remotely determining an estimate of the parasitic load on the battery based on the wirelessly transmitted plurality of vehicle parameters; and
wherein the estimate of the parasitic load on the battery is determined based upon: (1) a difference between a first estimate of a state of charge of the battery at a first time substantially contemporaneously with the beginning of one of the engine off-states and a second estimate of a state of charge of the battery at a second time subsequent just prior to the beginning of the engine on-state that immediately follows said prior engine-off state, and (2) an elapsed time between said first and second times;
wherein remotely determining an estimate of the parasitic load on the battery based on the wirelessly transmitted plurality of vehicle parameters comprises:
formatting the respective wirelessly transmitted plurality of vehicle parameters into a plurality of eciuations, each having the form:

$$\delta = (S_{off} - S_{on}) \times C = P \times T + \epsilon$$

in which $S_{off}$ is the respective estimate of the state of charge of the battery substantially contemporaneous with the beginning of an engine-off state, and $S_{on}$ is the respective estimate of the state of charge of the battery substantially just prior to the beginning of the engine-on state that immediately follows the engine-off state, C is the battery reserved capacity in ampere*hours, P is the estimated parasitic load, T is an elapsed time between $S_{off}$ and $S_{on}$, δ is state of charge loss of the battery during the elapsed time T, and ϵ is a constant, so as to provide a set of linear equations of the form:

$$\begin{bmatrix} \delta_1 \\ \delta_2 \\ \vdots \\ \delta_M \end{bmatrix} = \begin{bmatrix} t_1 & 1 \\ t_2 & 1 \\ \vdots & \vdots \\ t_M & 1 \end{bmatrix} \cdot \begin{bmatrix} P \\ \varepsilon \end{bmatrix}$$

in which M is the number of observations, $t_i$(i=1 ... M) is the instance of elapsed time and $\delta_i$(i=1 ... M) is the instance of state of charge loss; and solving the set of linear equations to provide a statistical estimation of the parasitic load across the plurality of vehicles.

14. The process according to claim 13 further including providing a notification of excessive parasitic load on the battery.

15. The process according to claim 13 further comprising:
remotely determining an undesirable state of charge condition of the battery based on the wirelessly transmitted plurality of vehicle parameters; and
providing a notification of the undesirable state of charge condition based on the wirelessly transmitted estimated reduction in the state of charge of the battery.

16. The process according to claim 13 wherein a least-square curve fitting method is employed in solving the set of linear equations.

* * * * *